(12) United States Patent
Kim et al.

(10) Patent No.: US 9,190,164 B1
(45) Date of Patent: Nov. 17, 2015

(54) SEMICONDUCTOR DEVICE AND OPERATING METHOD THEREOF

(71) Applicant: SK hynix Inc., Gyeonggi-do (KR)

(72) Inventors: Nam Kyeong Kim, Gyeonggi-do (KR); Sung Dae Choi, Chungcheongnam-do (KR); Jae Hyeon Shin, Seoul (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 14/531,636

(22) Filed: Nov. 3, 2014

(30) Foreign Application Priority Data

Jun. 2, 2014 (KR) .................. 10-2014-0067008

(51) Int. Cl.
*G11C 7/02* (2006.01)
*G11C 16/26* (2006.01)
*G11C 16/04* (2006.01)
*G11C 7/22* (2006.01)

(52) U.S. Cl.
CPC *G11C 16/26* (2013.01); *G11C 7/02* (2013.01); *G11C 7/227* (2013.01); *G11C 16/0483* (2013.01)

(58) Field of Classification Search
CPC .................................. G11C 7/02; G11C 7/227
USPC .......... 365/185.17, 185.02, 189.15, 193, 196, 365/210.11
See application file for complete search history.

(56) References Cited

U.S. PATENT DOCUMENTS

| 5,901,098 A * | 5/1999 | Sim et al. ...................... 365/206 |
| 2007/0297228 A1* | 12/2007 | Song et al. ............... 365/185.08 |
| 2010/0284226 A1* | 11/2010 | Noh .......................... 365/185.22 |
| 2010/0315883 A1* | 12/2010 | Lee .......................... 365/185.25 |
| 2014/0369133 A1* | 12/2014 | Lee .......................... 365/185.21 |

FOREIGN PATENT DOCUMENTS

KR  1020100091413  8/2010

* cited by examiner

*Primary Examiner* — Hoai V Ho
*Assistant Examiner* — Jay Radke
(74) *Attorney, Agent, or Firm* — IP & T Group LLP

(57) ABSTRACT

A semiconductor device and a method of operating the same are provided. The semiconductor device includes a memory block including a plurality of pages having a plurality of first cells and a plurality of second cells, a circuit group configured to read first cells and second cells of a selected page of the pages a strobe signal control circuit configured to store source bouncing information generated during a read operation of the first cells of the selected page and output a strobe signal based on stored information, and a control circuit configured to control the circuit group in response to the strobe signal during a read operation of the second cells of the selected page.

20 Claims, 7 Drawing Sheets

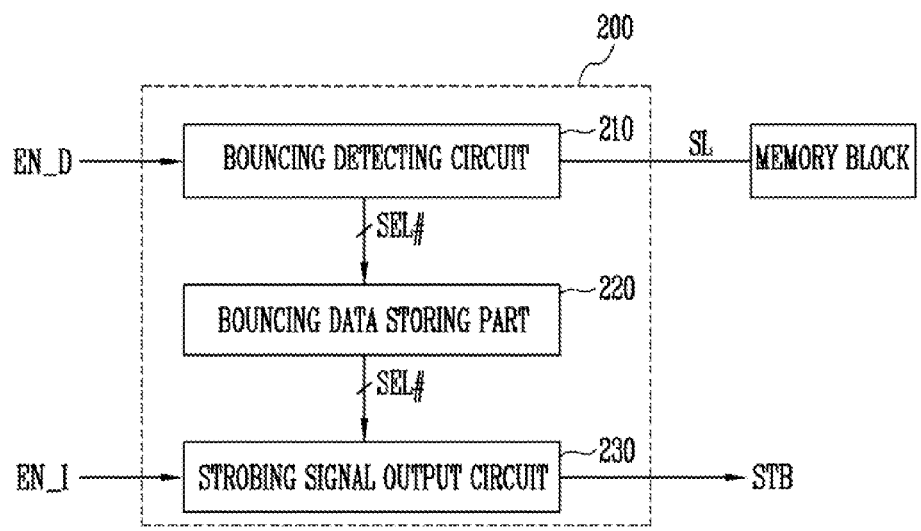

SEMICONDUCTOR DEVICE AND OPERATING METHOD THEREOF

CROSS-REFERENCE TO RELATED APPLICATION

The present application claims priority to Korean Patent Application Number 10-2014-0067008, filed on Jun. 2, 2014, the entire disclosure of which is incorporated herein in its entirety by reference.

BACKGROUND

1. Field of Invention

The present invention relates to a semiconductor device and an operating method thereof. More specifically, the present invention relates to a read operation of a semiconductor device.

2. Description of Related Art

Semiconductor devices generally include a memory cell array for storing data.

The memory cell array includes a plurality of memory blocks. In NAND flash type memory, the memory blocks include a plurality of cell strings connected between bit lines and a source line. For example, each cell string includes a source select transistor, a plurality of memory cells and a drain select transistor connected in series between the bit line and the source line.

In a read operation (or, a verification operation) of the semiconductor device, bit lines are precharged, and a source line is grounded. At this time, a read voltage is applied to a selected word line and it is determined, based on variation in potentials of the bit lines whether, selected memory cells are programmed.

Because the source line is commonly connected to the plurality of cell strings, the potential of the source line may be temporarily increased in the read operation by a variety of complex causes, such as degradation of the source line or current flowing in the cell string, etc. The above-mentioned phenomenon is called source bouncing.

In particular, when source bouncing occurs during a read operation, the threshold voltage of the selected memory cells may be higher than the read voltage, although the threshold voltage of the selected memory cells should be lower than the read voltage. That is, the threshold voltage of the memory cells may be higher than the actual threshold voltage thereof. Thus, the reliability of read operations may be degraded.

Therefore, research for decreasing source bouncing has been actively studied. However, source bouncing has not been eliminated.

SUMMARY

The present invention is directed to a semiconductor device and an operating method thereof, which is capable of performing reading or verifying operations based on information obtained by a feedback of source bouncing instead of decreasing the source bouncing. Thus, the source bouncing is compensated although the source bouncing has occurred.

One embodiment of the present invention provides a semiconductor device including a memory block including a plurality of pages having a plurality of first cells and a plurality of second cells, a circuit group suitable for reading first cells and second cells of a selected page of the pages, a strobe signal control circuit suitable for storing source bouncing information generated during a read operation of the first cells of the selected page and outputting a strobe signal based on the stored information, and a control circuit suitable for controlling the circuit group in response to the strobe signal during a read operation of the second cells of the selected page.

Another embodiment of the present invention provides a method of operating a semiconductor device including performing a read operation on a plurality of first cells of a selected page, detecting source bouncing generated during the read operation of the first cells and storing bouncing data for detected information, and performing a read operation on a plurality of second cells of the selected page, while blocking the read operation of the second cells during the source bouncing based on the bouncing data.

According to the present invention, the source bouncing generated during the read operation is fed back, and the read operation is performed based on the fedback operation. Thus, the source bouncing is compensated. Therefore the reliability of the reading and verifying operations of the semiconductor device may be improved.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIG. 3 is a block diagram illustrating a strobe signal control circuit shown in FIG. 1;

FIG. 4 is a table illustrating bouncing data stored in a bouncing data storing part shown in FIG. 3;

DETAILED DESCRIPTION

Figure 1:
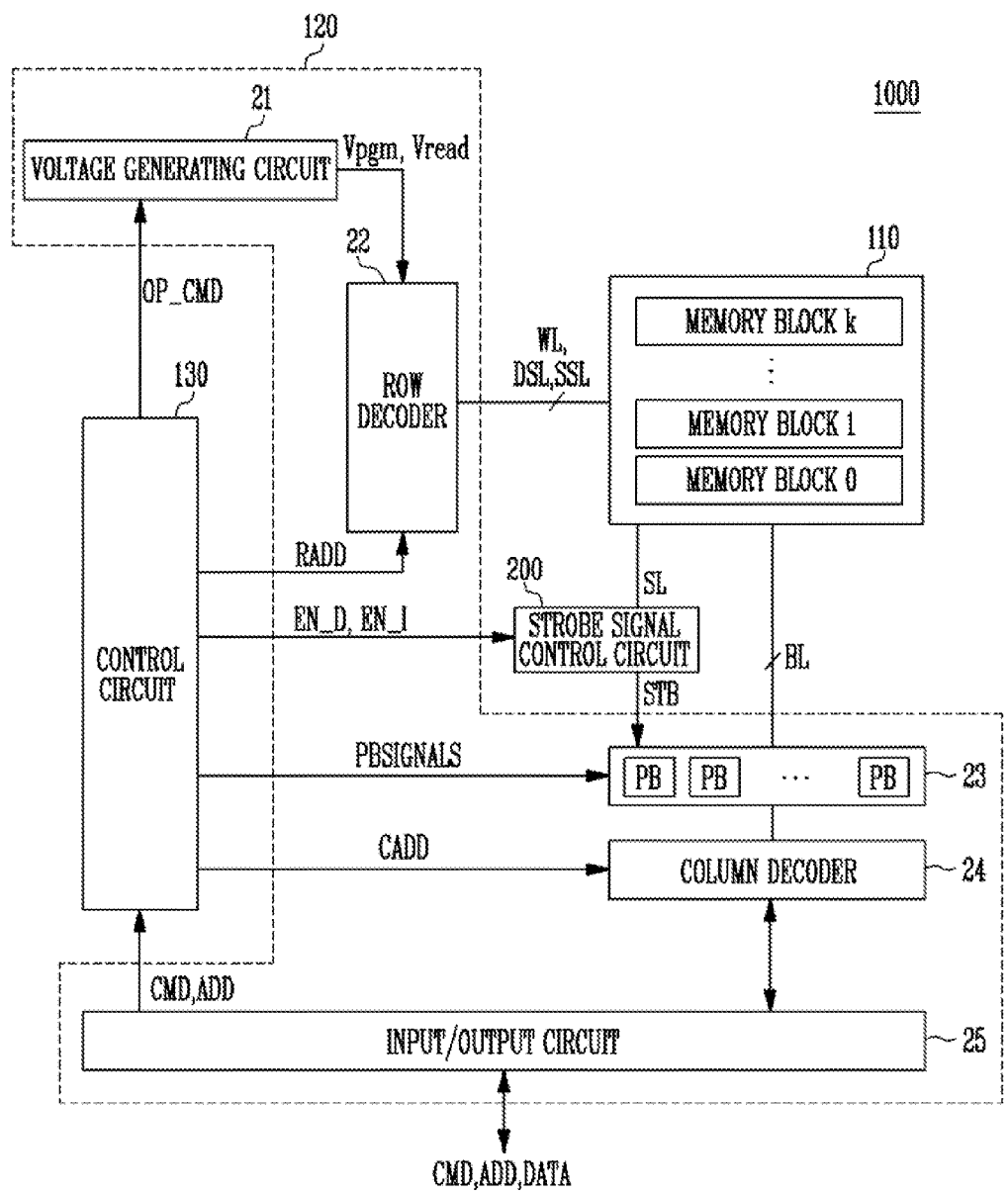
FIG. 1 is a block diagram illustrating a semiconductor device according to an exemplary embodiment of the present invention.

The present invention will be described more fully hereinafter with reference to the accompanying drawings, in which exemplary embodiments of the invention are shown. This invention may, however, be embodied in different forms and should not be construed as limited to the embodiments set forth herein. These embodiments are provided so that this disclosure will be thorough and complete, and will fully convey the scope of the present invention to those skilled in the art. Throughout the disclosure, like reference numerals correspond directly to the like numbered parts in the various figures and embodiments.

In this specification, a singular form may include a plural form as long as it is not specifically mentioned. Furthermore, 'include/comprise' or 'including/comprising' used in the specification represents that one or more components, steps, operations, and elements exist or are added.

FIG. 1 is a block diagram illustrating a semiconductor device according to an exemplary embodiment of the present invention;

Referring to FIG. 1, the semiconductor device 1000 includes a memory cell array 110, a circuit group 120, a strobe signal control circuit 200, and a control circuit 130. Data is stored in the memory cell array 110. The circuit group 120 performs program, read and erase operations of the memory cell array 110. The strobe signal control circuit 200 outputs a strobe signal during the read operation of the memory cell array 110. The control circuit 130 controls the circuit group 120 and the strobe signal control circuit 200.

The memory cell array 110 includes 0 to k-th memory blocks. The 0 to k-th memory blocks have substantially the same structure. A detailed explanation of the structure of the memory blocks will be followed with reference to FIG. 2.

The circuit group 120 includes a voltage generating circuit 21, a row decoder 22, a page buffer group 23, a column decoder 24, and an input-output circuit 25.

The voltage generating circuit 21 generates operation voltages having various levels in response to an operation command signal OP_CMD. The operation command signal OP_CMD may include a program command signal, a read command signal, and an erase command signal. For example, the voltage generating circuit 21 generates a program voltage Vpgm, a read voltage Vread, a pass voltage Vpass (not shown), voltages having various levels, etc.

The row decoder 22 selects one of the memory blocks of the memory cell array 110 in response to a row address RADD and applies the operation voltages to a word line WL, a drain select line DSL and a source select line SSL of the selected memory block.

The page buffer group 23 includes a plurality of page buffers PB connected to the memory blocks through bit lines BL. The page buffer group 23 temporarily stores data of selected pages in latches in response to page buffer control signals PBSIGNALS and a strobe signal STB during the program, read, and erase operations. In particular, the page buffer group 23 blocks the bit lines from the latches to prevent the voltage variation caused by the source bouncing from being transmitted to the latches.

The column decoder 24 exchanges data with the page buffer group 23 in response to a column address CADD.

The input-output circuit 25 transmits an externally received command signal CMD and address ADD to the control circuit 130, and transmits externally received data DATA to the column decoder 24. Also, the input-output circuit 25 outputs the data DATA transmitted from the column decoder 24.

The strobe signal control circuit 200 operates in response to a detection enable signal EN_D and an output enable signal EN_I. More particularly, the strobe signal control circuit 200 detects the source bouncing that is generated in the source line SL during reading of the flag cells of the selected page of the selected memory block, and stores the detected source bouncing as data. Also, the strobe signal control circuit 200 outputs an activated strobe signal STB based on the data stored in the selected page in response to the output enable signal EN_I.

The control circuit 130 outputs the operation command signal OP_CMD, the row address RADD, the detection enable signal EN_D, the output enable signal EN_I, the page buffer control signals PBSIGNALS, and the column address CADD for controlling the circuit group 120 in response to the command signal CMD and the address ADD.

In particular, the control circuit 130 detects the source bouncing during the reading of the flag cells of the selected page in the reading or verifying operation of the selected page of the selected memory block. Thus, although the source bouncing is generated, the control circuit 130 controls the circuit group 120 so that the voltage variation caused by the generated source bouncing is not transmitted to the page buffer group 23 during the reading or verifying operation of the main cells of the selected page.

Figure 2:
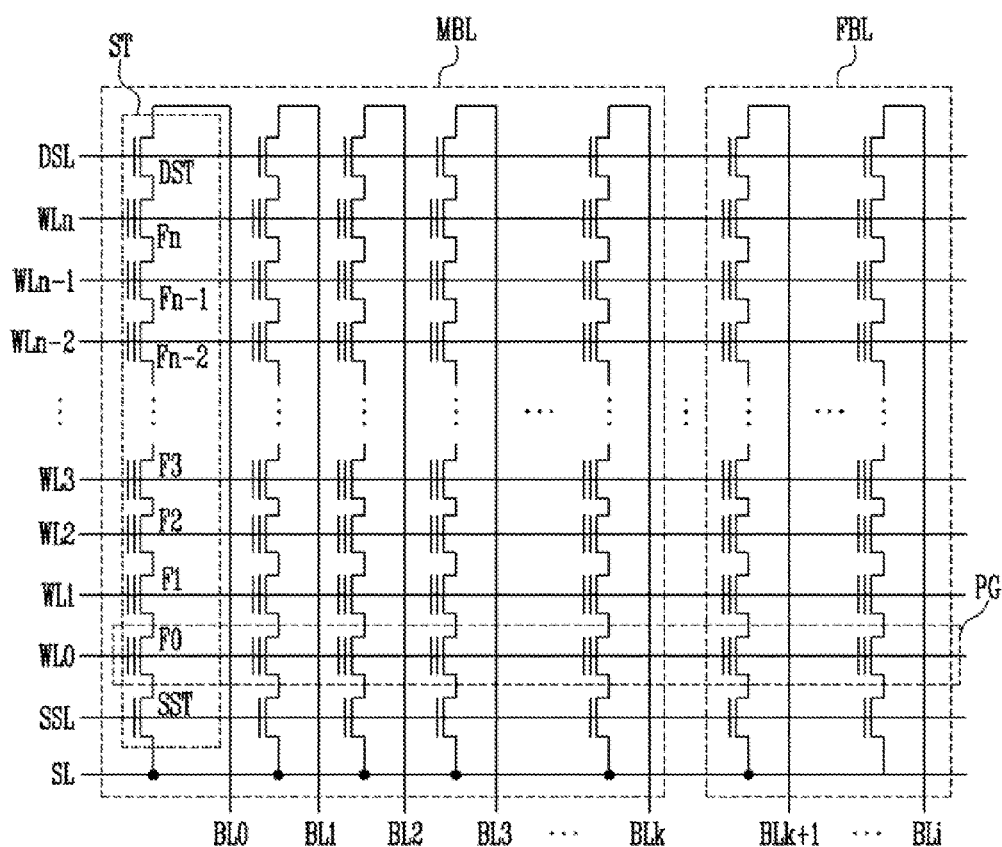
FIG. 2 is a circuit diagram illustrating a memory block shown in FIG. 1.

FIG. 2 is a circuit diagram illustrating a memory block shown in FIG. 1. In FIG. 1, the 0 to k-th memory blocks are shown, and all of the memory blocks shown in FIG. 1 are substantially the same. Thus, one memory block of the 0 to k-th memory blocks will be exemplary explained.

Referring to FIG. 2, the memory block includes a main sub block MBL and a flag sub block FBL. The main sub block MBL includes a plurality of main cells, and the flag sub block FBL includes a plurality of flag cells. The main sub block MBL and the flag sub block FBL include a plurality of cell strings ST connected between bit lines BL0 to BLi and a source line SL. For example, the cell strings ST connected to the 0 to k-th bit lines BL0 to BLk are included in the main sub block MBL. The cell strings ST connected to the (k+1)-th to i-th bit lines BLk+1 to BLi are included in the flag sub block FBL. The source line SL is commonly connected to the memory blocks, and is connected to a ground terminal.

The cell strings ST are substantially the same as each other. For example, a string ST connected to the 0 bit line BL0 includes a source select transistor SST, a plurality of memory cells F0 to Fn and a drain select transistor DST connected in series to each other between the source line SL and the 0 bit line BL0. Gates of source select transistors SST of different cell strings ST are connected to a source select line SSL. Gates of the memory cells F0 to Fn are connected to 0 to nth word lines WL0 to WLn. Gates of drain select transistors DST of the different cell strings ST are connected to a drain select line DSL. A group of memory cells connected to the same word line is referred to as a page PG. Thus, each page PG has a plurality of memory cells included in the main sub block MBL and a plurality of flag cells included in the flag sub block FBL. Program data is stored in the main cells, and information of the page PG is stored in the flag cells included therein. For example, the information of the page PG includes least significant bit (LSB) information and most significant bit (MSB) information.

FIG. 3 is a block diagram illustrating a strobe signal control circuit shown in FIG. 1.

Referring to FIG. 3, the strobe signal control circuit 200 includes a bouncing detecting circuit 210, a bouncing data storing part 220, and a strobe signal output circuit 230.

The bouncing detecting circuit 210 detects the voltage variation of the source line SL in response to the detection enable signal EN_D. For example, when the read operation of the selected page starts, the control circuit 130 (shown in FIG. 1) reads the flag cells included in the selected page to get the LSB information and the MSB information. Also, the control circuit 130 (shown in FIG. 1) controls the circuit group 120 (shown in FIG. 1) to read the main cells of the selected page based on the LSB information and the MSB information. When the flag cells of the selected page are read, the control circuit 130 (shown in FIG. 1) outputs the detection enable signal END, and the bouncing detecting circuit 210 detects the voltage variation of the source line SL in response to the detection enable signal EN_D. Also, the control circuit 130 stores the bouncing data SEL# in the bouncing data storing part 220. The bouncing data includes the source bouncing information of the selected page of the selected memory block.

The bouncing data storing part 220 includes storage in which the bouncing data SEL# for each memory block and each page may be stored.

The strobe signal output circuit 230 outputs a strobe signal STB based on the bouncing data SEL# of the selected page of the selected block in response to the output enable signal EN_I. For example, when the main cells of the selected page are read, the control circuit 130 outputs the output enable signal EN_I, so that the strobe signal output circuit 230 controls the active period and timing of the strobe signal STB based on the bouncing data SEL# in response to the output enable signal EN_I.

FIG. 4 is a table illustrating bouncing data stored in a bouncing data storing part shown in FIG. 3.

Referring to FIG. 4, the bouncing data storing part 220 includes a plurality of storage spaces. The information on the memory block and the page, the analog level of the source line SL, and the pass/fail data of the verifying operation for the page are stored in each storage space. For example, the first bouncing data SEL<1> includes information '0' for the 0th memory block, information '0' for the 0th page, information '9.5' for the analog level, information '0' for a fail of the verifying operation, etc. That is, the first bouncing data SEL<1> represents the information in which the flag cells of the 0th page of the 0th memory block are read, the source bouncing is generated at 9.5 level, and the verifying operation fails. The second bouncing data SEL<2> includes information '0' for the 0th memory block, information '1' for the 1st page, information '10' for the analog level, information '1' for a pass of the verifying operation, etc. That is, the second bouncing data SEL<2> represents the information in which the flag cells of the 1st page of the 0th memory are read, the source bouncing is generated at 10 level, and the verifying operation passes. In the same method, the M-th bouncing data SEL<M> includes information 'k' for the k-th memory block, information 'n' for the n-th page, information '10' for the analog level, information '1' for a pass of the verifying operation, etc. That is, the M-th bouncing data SEL<M> represents the information in which the flag cells of the n-th page of the k-th memory are read, the source bouncing is generated at 10 level, and the verifying operation passes.

That is, the bouncing data storing part 220 stores the source bouncing information generated during the read operation of the flag cells of each page. The strobe signal output circuit 230 (shown in FIG. 3) receives one specific parcel of the bouncing data SEL<1> to SEL<M> for the selected page of the selected memory block during the read operation of the main cells. The strobe signal output circuit 230 outputs the strobe signal STB based on the received bouncing data.

The information included in the bouncing data is an example for explaining the present invention. The bouncing data may have different information based on various semiconductor devices. Also, the bouncing data may further include temporal information of generation of the source bouncing. For example, the bouncing data may further include a start time and a termination time of the source bouncing.

Figure 5:
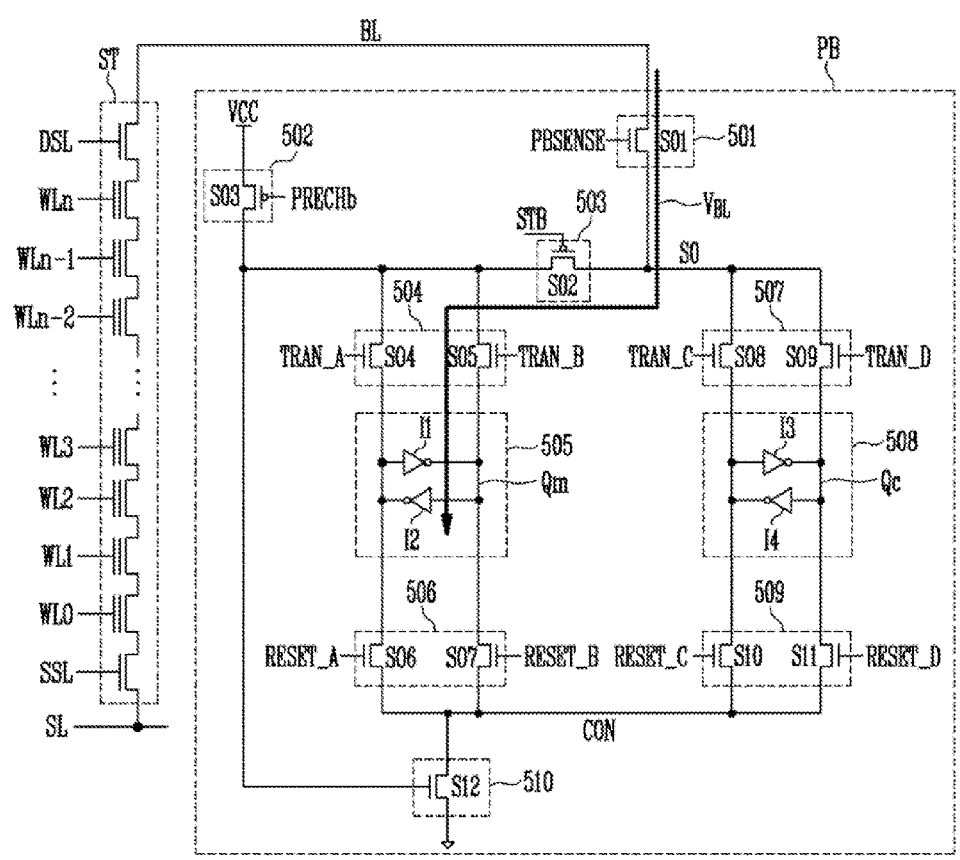
FIG. 5 is a circuit diagram illustrating a page buffer for explaining a read operation method according to an exemplary embodiment of the present invention.

FIG. 5 is a circuit diagram illustrating a page buffer for explaining a read operation method according to an exemplary embodiment of the present invention.

Referring to FIG. 5, when the main cells of the selected page are read, the bit line BL is blocked from a main latch 505 by the strobe signal STB applied to the page buffer PB. In FIG. 5, an exemplary page buffer PB is illustrated for the explanation of the read operation of the present invention.

The structure of the page buffer PB will be explained as follows.

The page buffer PB may include a sensing circuit 501, a precharge circuit 502, a strobe switching part 503, a first transmission circuit 504, the main latch 505, a first reset circuit 506, a second transmission circuit 507, a cache latch 508, a second reset circuit 509, and a discharge circuit 510. The elements 501, 502, 504, 505, 506, 507, 508, 509, and 510 except the strobe switching part 503 are operated in response to the signals of the page buffer control signal PBSIGNALS. The strobe switching part 503 is operated in response to the strobe signal STB. The elements 501, 502, 504, 505, 506, 507, 508, 509, and 510 except the strobe switching part 503 that is connected between the bit line BL and the main latch 505 may be changed in various semiconductor devices.

The sensing circuit 501 connects the bit line BL to a sensing node SO in response to a sensing signal PBSENSE. For example, the sensing circuit 501 may include an NMOS transistor S01 that is turned on/off in response to the sensing signal PBSENSE.

The precharge circuit 502 precharges the sensing node SO with a positive voltage in response to a precharge signal PRECHb. For example, the precharge circuit 502 may include a PMOS transistor S03 that is turned on/off in response to the precharge signal PRECHb.

The strobe switching part 503 connects the sensing node SO to the first transmission circuit 504 in response to the strobe signal STB. For example, the strobing switching part 503 may include a PMOS transistor S02 that is turned on/off in response to the strobe signal STB. Thus, when the strobe signal STB is activated to be high, the strobe switching part 503 is turned off so that the sensing node SO is blocked from the first transmission circuit 504. When the strobe signal STB is deactivated to be low, the strobe switching part 503 is turned on so that the sensing node SO is connected to the first transmission circuit 504.

The first transmission circuit 504, the main latch 505, and the first reset circuit 506 are connected between the sensing node SO and a common node CON. The first transmission circuit 504, the main latch 505, and the first reset circuit 506 are connected to the sensing node SO through the strobe switching part 503. The second transmission circuit 507, the cache latch 508 and the second reset circuit 509 is connected between the common node CON and the sensing node SO.

The first transmission circuit 504 may include NMOS transistors S04 and S05 that are connected between the sensing node SO and the main latch 505 in parallel. One transistor S04 of the NMOS transistors S04 and 505 is turned on/off in response to a first transmission signal TRAN_A and another transistor S05 of the NMOS transistors S04 and S05 is turned on/off in response to a second transmission signal TRAN_B.

The main latch 505 includes a first inverter and a second inverter I2, and is connected between the first transmission circuit 504 and the first reset circuit 506. When an output node of the first inverter I1 is defined to be a main node Qm, the data of the main node Qm may be maintained or changed in response to the voltage $V_{BL}$ of the bit line BL by the read operation, so that the program state of the selected memory cell is determined in response to the data stored in the main node Qm. Thus, in the read operation, when all of the NMOS transistor S05 of the first transmission circuit 504, the PMOS transistor S02 of the strobe switching part 503, and the NMOS transistor S01 of the sensing circuit 501 are turned on, the bit line BL is connected to the main latch 505 so that the bit line voltage $V_{BL}$ is transmitted to the main node Qm. When the NMOS transistor S05 of the first transmission circuit 504 and the NMOS transistor S01 of the sensing circuit 501 are turned on and the PMOS transistor S02 of the strobe switching part 503 is turned off, the bit line voltage $V_{BL}$ is not transmitted to the main latch (Qm).

The first reset circuit 505 may include NMOS transistors S06 and 507 that are connected between the main latch 505 and the common node CON in parallel. One transistor S05 of the NMOS transistors S05 and S07 is turned on/off in response to a first reset signal RESET_A and another transistor S07 of the NMOS transistors S06 and 507 is turned on/off in response to a second reset signal RESET_B.

The second transmission circuit 507 may include NMOS transistors S05 and 509 that are connected between the sensing node SO and the cache latch 508 in parallel. One transistor S08 of the NMOS transistors S08 and S09 is turned on/off in response to a third transmission signal TRAN_C and another transistor S09 of the NMOS transistors S08 and 509 is turned on/off in response to a fourth transmission signal TRAN_D.

The cache latch 508 includes a third inverter I3 and a fourth inverter I4, and is connected between the second transmission circuit 507 and the second reset circuit 509. An output node of the third inverter I3 is defined as a cache node Qc.

The second reset circuit 509 may include NMOS transistors S10 and S11 that are connected between the cache latch 508 and the common node CON in parallel. One transistor S10 of the NMOS transistors S10 and S11 is turned on/off in response to a third reset signal RESET_C and another transistor S11 of the NMOS transistors S10 and S11 is turned on/cuff in response to a fourth reset signal RESET_.

Figure 6:
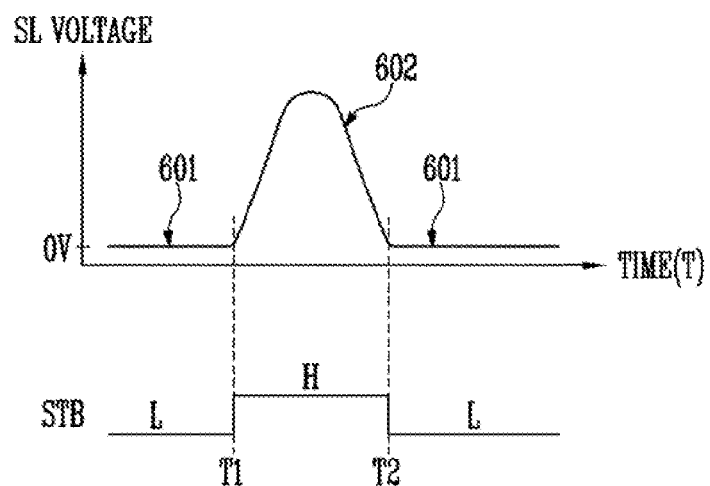
FIG. 6 is a graph illustrating a strobe signal caused by the generation of the source bouncing.

FIG. 6 is a graph illustrating a strobe signal caused by the generation of the source bouncing.

Referring to FIG. 6, in the read operation of the main cells, when the voltage of the source line SL is 0V (601), the strobe signal STB is deactivated to be low L. When the voltage of the source line SL is increased by the source bouncing (602), the strobe signal STB is activated to be high H. In particular, the time for activating the strobe signal STB may be controlled in each page during the read operation of the selected main cells by using the start time T1 and the termination time T2 of the source bouncing.

Figure 7:
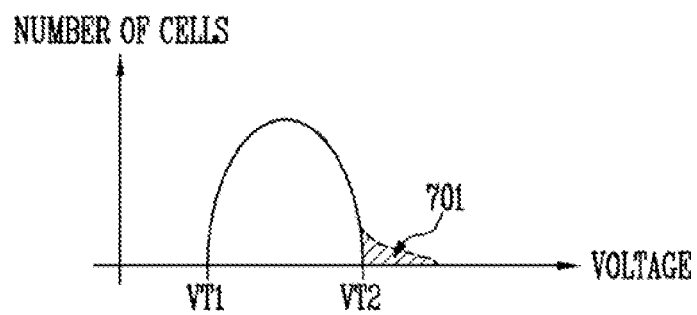
FIG. 7 is a graph illustrating an effect of an exemplary embodiment of the present invention.

FIG. 7 is a graph illustrating an effect of an exemplary embodiment of the present invention.

Referring to FIG. 7, according to the prior art, when the main cells are read without considering the source bouncing, the memory cells may be read at a higher voltage (701) than the actual threshold voltage thereof.

However, according to the exemplary embodiment of the present invention, the strobe signal STB is activated to the high state H based on the information of the time and level of the generation of the source bouncing in each page of each memory block. Thus, the variation of the bit line voltage $V_{BL}$ caused by the source bouncing may not be transmitted to the main latch 505 during the read operation of the main cells included in different pages. Therefore, reliability of the read operation of the main cells having threshold voltages between a first threshold voltage VT1 and a second threshold voltage VT2 may be improved.

In the above-mentioned exemplary embodiment, the read operation is explained. However, the above-mentioned inventive concept may also be applied to a verifying operation included in a program operation or erase operation, because the verifying operation has substantially the same process as the read operation.

Figure 8:
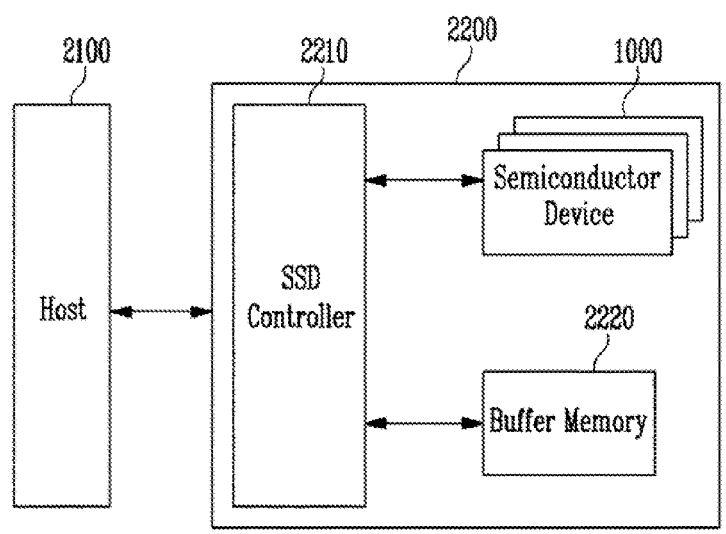
FIG. 8 is a block diagram illustrating a solid state drive including a semiconductor device according to an exemplary embodiment of the present invention.

FIG. 8 is a block diagram illustrating a solid state drive including a semiconductor device according to an exemplary embodiment of the present invention.

Referring to FIG. 8, a drive device 2000 includes a host 2100 and a solid state drive (SSD) 2200. The SSD 2200 includes an SSD controller 2210, a buffer memory 2220, and a semiconductor device 1000.

The SSD controller 2210 physically connects the host 2100 to the SSD 2200. That is, the SSD controller 2210 provides an interface depending on a bus format of the host 2100. In particular, the SSD controller 2210 decodes commands provided from the host 2100. As a result of the decoding, the SSD controller 2210 accesses the semiconductor device 1000. The bus format of the host 2100 may include a universal serial bus (USB), a small computer system interface (SCSI), a peripheral component interconnect (PCI) express, an advanced technology attachment (ATA), a parallel ATA (IATA), a serial ATA (SATA), a serial attached SCSI (SAS), etc.

Program data provided from the host 2100 or data read from the semiconductor device 1000 may be temporarily stored in the buffer memory 2220. When the host 2100 requests a read operation and data in the semiconductor device 1000 is cached, the buffer memory 2220 performs a caching operation in which the cache data is directly supplied to the host 2100. In general, the data transfer speed of the bus format (for example, SATA or SAS) of the host 2100 is faster than the transmission speed of the memory channel of the SSD 2200. That is, although the interface speed of the host 2100 is faster than the transmission speed of the memory channel of the SSD 2200, the difference between the transmission speed of the buffer memory 2220 of the high capacity and the interface speed of the host 2100 may be minimized, thereby preventing degradation of performance. The buffer memory 2220 may include synchronous DRAM having enough buffer capacity in the SSD 2200.

The semiconductor device 1000 may be used as a storing device of the SSD 2200. For example, the semiconductor device 1000 may be used as a nonvolatile memory device of high capacity as explained with reference to FIG. 1. In particular, the semiconductor device 1000 may be used as a NAND-type flash memory.

Figure 9:
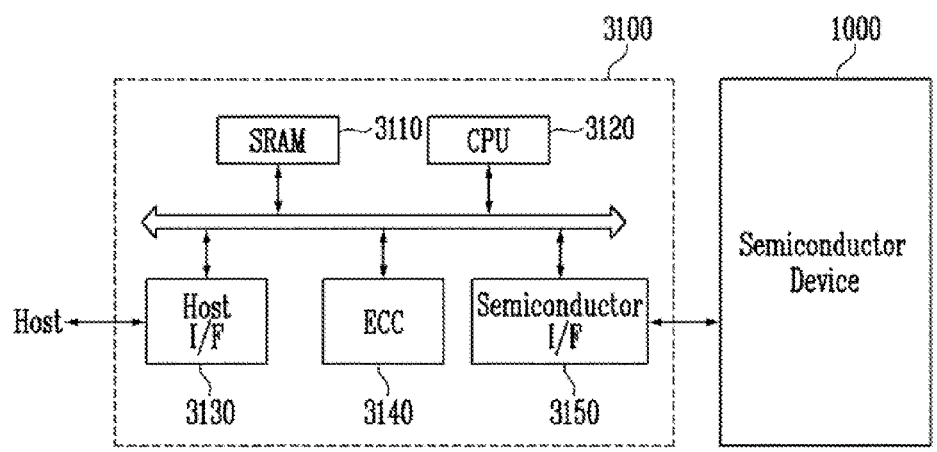
FIG. 9 is a block diagram illustrating a memory system including a semiconductor device according to an exemplary embodiment of the present invention.

FIG. 9 is a block diagram illustrating a memory system including a semiconductor device according to an exemplary embodiment of the present invention.

Referring to FIG. 9, the memory system 3000 may include a memory controller 3100 and a semiconductor device 1000.

The semiconductor device 1000 may be substantially the same as shown in FIG. 1. Thus, any repetitive explanations concerning the same elements will be omitted.

The memory controller 3100 may have a structure configured to control the semiconductor device 1000. A static random access memory (SRAM) 3110 may be used as a working memory. A host interface (I/F) 3130 may include a data exchange protocol of a host connected to the memory system 3000. An error correct circuit (ECC) 3140 in the memory controller 3100 may detect or correct an error in the data read from the semiconductor device 1000. A semiconductor interface (I/F) 3150 may interface with the semiconductor device 1000. A central processing unit (CPU) 3120 controls data exchange of the memory controller 3100. Also, though not shown in FIG. 9, the memory system 3000 may further include a read only memory (ROM) configured to store code data for interfacing with the host.

The memory system 3000 of the present invention may be applied to a computer, an ultra mobile PC (UMPC), a workstation, a net-book, a personal digital assistant (PDA), a portable computer, a web tablet, a wireless phone, a mobile phone, a smart phone, a digital camera, a digital audio recorder, a digital audio player, a digital picture recorder, a digital picture player, a digital video recorder, a digital video player, a device configured to transfer and receive information wirelessly one of various devices configured to compose a home network, etc.

Figure 10:
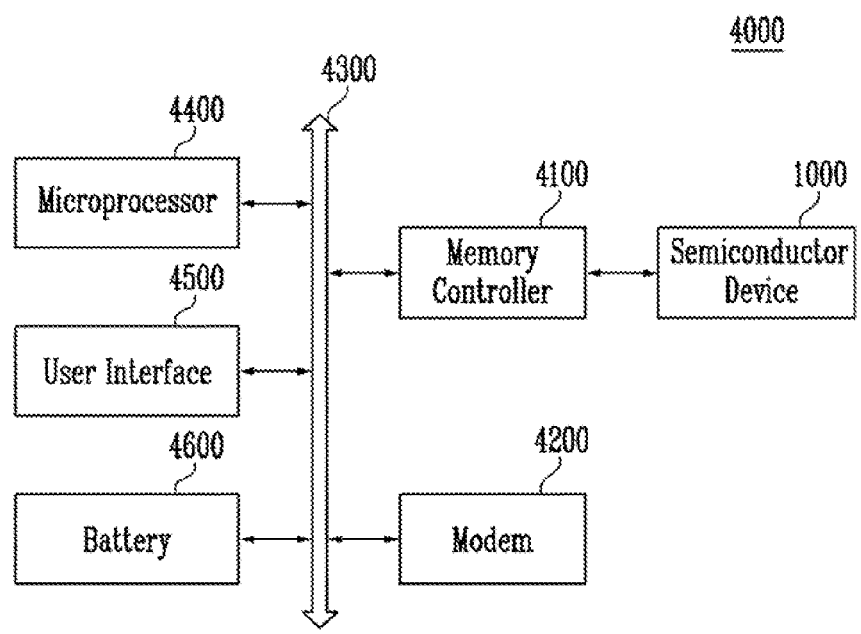
FIG. 10 is a block diagram illustrating a computing system including a semiconductor device according to an exemplary embodiment of the present invention.

FIG. 10 is a block diagram illustrating a computing system including a semiconductor device according to an exemplary embodiment of the present invention.

Referring to FIG. 10, the computing system 4000 includes a semiconductor device 1000, a memory controller 4100, a modem 4200, a microprocessor 4400, and a user interface 4500, which are electrically connected to a bus 4300. When the computing system 4000 is a mobile device, the computing system 4000 may further include a battery 4600. Though not shown in FIG. 10, the computing system 4000 may further include an application chip set, a camera image processor (CIS), a mobile DRAM, etc.

The semiconductor device 1000 may have substantially the same structure as shown in FIG. 1. Thus, any repetitive explanation concerning the semiconductor device 1000 will be omitted.

The memory controller 4100 and the semiconductor device 1000 may compose a solid state drive/disk (SSD).

The semiconductor device 1000 and the memory controller 4100 of the present invention may be mounted using various packages. For example, the semiconductor device 1000 and the memory controller 4100 of the present invention may be mounted using packages such as a package on package (PoP), a ball grid array (BGA), a chip scale package (CSP), a plastic leaded chip carrier (PLCC), a plastic dual in-line package (DIP), a die in wafer pack, a die in wafer form, a chip on board (COB), a ceramic dual in-line package (CERDIP), a plastic metric quad flat pack (MQFP), a thin quad flat pack (TQFP), a small outline integrated circuit (SOIC), a shrink small outline package (SSOP), a thin small outline package (TSOP), a system in package (SIP), a multi chip package (MCP), a wafer-level fabricated package (WFP), a wafer-level processed stack package (WSP), etc.

In the drawings and specification, there typical exemplary embodiments of the invention have been disclosed and, although specific terms are employed, they are used in a generic and descriptive sense only and not for purpose of limitation. As for the scope of the invention, it is set forth in the following claims. Therefore, it will be understood by those of ordinary skill in the art that various changes in form and detail may be made without departing from the spirit and scope of the present invention as defined by the following claims.

What is claimed is:

1. A semiconductor device comprising:
 a memory block including a plurality of pages having a plurality of first cells and a plurality of second cells;
 a circuit group suitable for reading first cells and second cells of a selected page of the pages;
 a strobe signal control circuit suitable for storing source bouncing information generated during a read operation of the first cells of the selected page and outputting a strobe signal based on the stored information; and
 a control circuit suitable for controlling the circuit group in response to the strobe signal during a read operation of the second cells of the selected page.

2. The semiconductor device of claim 1, wherein the memory block comprises:
 a first sub block including the first cells; and
 a second sub block including the second cells.

3. The semiconductor device of claim 2, wherein the first sub blocks and the second sub blocks share the pages, and include a plurality of cell strings connected between a plurality of bit lines and a source line.

4. The semiconductor device of claim 3, wherein the bit lines are connected to the cell strings, respectively, and the source line is commonly connected to the cell strings.

5. The semiconductor device of claim 1, wherein the circuit group comprises:
 a voltage generating circuit suitable for generating operation voltages of various levels in response to an operation command signal;
 a row decoder suitable for selecting the memory block in response to a row address;
 a page buffer group suitable for exchanging data with the memory block through bit lines, and blocking data transmitted through the bit lines in response to the strobe signal during the read operation of the second cells of the selected page;
 a column decoder suitable for exchanging data with the page buffer group in response to a column address; and
 an input-output circuit suitable for transmitting an externally received command signal and address to the control circuit, and exchanging externally received data with the column decoder.

6. The semiconductor device of claim 1, wherein the strobe signal control circuit stores the source bouncing information for each of the pages in response to a detection enable signal, and outputs the strobe signal based on the stored source bouncing information in response to an output enable signal.

7. The semiconductor device of claim 6, wherein the strobe signal control circuit comprises:
 a bouncing detecting circuit suitable for detecting the source bouncing information generated during the read operation of the first cells of the selected page, and outputting bouncing data for the detected information, in response to the detection enable signal;
 a bouncing data storing part suitable for storing the bouncing data; and
 a strobing signal output circuit configured to output the strobe signal based on the bouncing data corresponding to the selected page, in response to the output enable signal.

8. The semiconductor device of claim 7, wherein the source bouncing information comprises information of a start time and a termination time for detecting the source bouncing, the memory block and the selected page.

9. The semiconductor device of claim 7, wherein the strobe signal output circuit activates the strobe signal during the source bouncing generated in the read operation of the first cells of the selected page.

10. The semiconductor device of claim 7, wherein the strobe signal output circuit controls an active period and timing of the strobe signal based on the bouncing data.

11. The semiconductor device of claim 5, wherein the page buffer group comprises a plurality of page buffers connected to the bit lines, respectively.

12. The semiconductor device of claim 11, wherein each of the page buffers comprises:
 a main latch suitable for temporarily storing data;
 a sensing circuit suitable for connecting a bit line and a sensing node to transmit a voltage of the bit line to the sensing node in response to a sensing signal; and
 a strobe switching part suitable for connecting the sensing node to the main latch or block the sensing node from the main latch in response to the strobe signal.

13. The semiconductor device of claim 12, wherein the strobe switching part comprises a PMOS transistor that is turned on or turned off in response to the strobe signal.

14. The semiconductor device of claim 13, wherein the strobe signal is deactivated to be low in the read operation of the second cells of the selected page when the source bouncing is not generated, and activated to be high in the read operation of the second cells of the selected page when the source bouncing is generated.

15. A method of operating a semiconductor device, comprising:
   performing a read operation on a plurality of first cells of a selected page;
   detecting source bouncing generated during the read operation of the first cells and storing bouncing data for detected information; and
   performing a read operation on a plurality of second cells of the selected page, while blocking the read operation of the second cells during the source bouncing based on the bouncing data.

16. The method of claim 15, wherein the bouncing data comprises a level of the source bouncing, a start time and a termination time for generating the source bouncing, and information of the selected page and a memory block including the selected page.

17. The method of claim 15, wherein the read operation of the second cells of the selected page comprises:
   reading the second cells when the bouncing data is deactivated; and
   blocking the reading of the second cells when the bouncing data is activated.

18. The method of claim 17, wherein the blocking of the reading of the second cells when the bouncing data is activated comprises disconnecting bit lines connected to the second cells from page buffers.

19. The method of claim 15, wherein, after the performing of the read operation of the second cells of the selected page, the method further comprises:
   reading first cells of a next page;
   detecting source bouncing generated during the reading of the first cells of the next page, and storing bouncing data for the detected information; and
   reading second cells of the next page, while blocking the reading of the second cells during generation of the source bouncing based on the bouncing data of the next page.

20. The method of claim 19, wherein a period and timing for the blocking of the reading of the second cells are determined by the bouncing data.

* * * * *